United States Patent
Ikenaga

(10) Patent No.: US 9,948,178 B2
(45) Date of Patent: Apr. 17, 2018

(54) SEMICONDUCTOR DEVICE INCLUDING PLURALITY OF BOOSTER UNITS

(71) Applicant: Renesas Electronics Corporation, Kawasaki-shi (JP)

(72) Inventor: Yoshifumi Ikenaga, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 45 days.

(21) Appl. No.: 14/803,049

(22) Filed: Jul. 18, 2015

(65) Prior Publication Data

US 2016/0065059 A1    Mar. 3, 2016

(30) Foreign Application Priority Data

Sep. 3, 2014 (JP) ................. 2014-178835

(51) Int. Cl.
  *H02M 3/07* (2006.01)
  *H01L 29/00* (2006.01)

(52) U.S. Cl.
  CPC .............. *H02M 3/07* (2013.01); *H01L 29/00* (2013.01)

(58) Field of Classification Search
  CPC .. H02M 3/07; H02M 3/073; H02M 2003/071; H02M 2003/072; H02M 2003/075; H02M 2003/076; H02M 2003/077; H02M 2003/078; H03K 17/06; H03K 17/063; H03K 19/017; H03K 19/01728; H03K 19/01735; G11C 5/145
  USPC ........ 307/109, 110; 327/365, 379, 389, 390, 327/524, 530, 534, 535, 536, 537; 363/59, 60, 61
  See application file for complete search history.

(56) References Cited

U.S. PATENT DOCUMENTS

| | | | |
|---|---|---|---|
| 7,215,179 B2 | 5/2007 | Yamazoe et al. | |
| 2002/0101744 A1* | 8/2002 | DeMone | G04G 19/04 363/59 |
| 2004/0183114 A1* | 9/2004 | Eshel | G11C 5/145 257/300 |
| 2005/0030683 A1* | 2/2005 | Tailliet | H02M 3/073 361/18 |
| 2006/0006925 A1* | 1/2006 | Yamazoe | G11C 5/145 327/536 |

(Continued)

FOREIGN PATENT DOCUMENTS

JP        2005-333685 A    12/2005

*Primary Examiner* — Jeffrey Gblende
*Assistant Examiner* — David A. Singh
(74) *Attorney, Agent, or Firm* — McGinn IP Law Group, PLLC

(57) ABSTRACT

A semiconductor device includes a charge pump circuit having a plurality of booster units which are connected in series between an input terminal and an output terminal, each of the plurality of booster units includes: a main transistor that is diode-connected so as to cause a forward current to flow in a direction from an internal input terminal toward an internal output terminal; a sub-transistor that is connected between a first terminal of the main transistor and a back-gate terminal of the main transistor and has a control terminal connected to a second terminal of the main transistor; a resistor that connects the second terminal of the main transistor and the back-gate terminal of the main transistor; and a capacitor that is connected between the internal output terminal and a clock wire.

18 Claims, 16 Drawing Sheets

(56) References Cited

U.S. PATENT DOCUMENTS

2006/0013047 A1\* 1/2006 Sudou ................... G11C 5/145
365/189.09
2007/0096796 A1\* 5/2007 Firmansyah ............ H02M 3/07
327/536

\* cited by examiner

PHOTOVOLTAIC BATTERY

RF-DC CONVERSION CIRCUIT (HALF-WAVE RECTIFICATION)

RF-DC CONVERSION CIRCUIT (FULL-WAVE RECTIFICATION)

SEMICONDUCTOR DEVICE INCLUDING PLURALITY OF BOOSTER UNITS

CROSS-REFERENCE TO RELATED APPLICATIONS

This application is based upon and claims the benefit of priority from Japanese patent application No. 2014-178835, filed on Sep. 3, 2014, the disclosure of which is incorporated herein in its entirety by reference.

BACKGROUND

The present invention relates to a semiconductor device, and more particular, to a semiconductor device having a charge pump circuit, for example.

In recent years, from the viewpoint of the protection of the environment, many energy harvesting techniques of harvesting electric power from environmental electric waves to operate circuits have been proposed. In this energy harvesting technique, the voltage obtained from a harvesting power source is as low as 0.1 V to 0.2 V. Thus, in order to drive a microcomputer or the like, it is necessary to boost the supply voltage applied to a load circuit up to approximately 1 V using a booster circuit. Here, in the case of a switching regulator which uses an inductor, for example, a control voltage of approximately 0.6 V or higher is required to boost 0.1 V to 1.0 V. Thus, to realize a so-called cold-start, that is, a boosting operation from an initial voltage state of 0 V, it is necessary to generate a high potential using a transformer or a charge pump circuit. Among these devices, the charge pump circuit which does not require an external device to be attached thereto and is not expensive has approximately several to ten stages. When a NMOS transistor of which the substrate potential is fixed to 0 V (the ground voltage GND) is diode-connected to form a charge pump, a reverse substrate bias is applied as it proceeds to the subsequent stages. Thus, the performance (boosting potential and current feeding ability) of the charge pump circuit deteriorates. Japanese Unexamined Patent Application Publication No. 2005-333685 discloses an example of a charge pump circuit driven on the basis of low-voltage.

The charge pump circuit disclosed in Japanese Unexamined Patent Application Publication No. 2005-333685 includes a substrate-control MOS transistor that switches a supply source of a back-gate voltage so that the back-gate voltage of a PMOS transistor (transfer MOS transistor) serving as a rectifying device is supplied from a terminal having the higher voltage among the source and drain terminals.

SUMMARY

However, in the technique disclosed in Japanese Unexamined Patent Application Publication No. 2005-333685, since the voltage between the source and the back-gate is 0 V when the diode-connected transistor (transfer MOS transistor) allows a forward current to flow, it is difficult to supply a forward current sufficiently in a low voltage region of the input voltage, in particular. Thus, in the technique disclosed in Japanese Unexamined Patent Application Publication No. 2005-333685, it is difficult to sufficiently improve the boosting performance such as a boosting time and a boosted voltage. The other objects and new features will become apparent from the description of the present specification and the accompanying drawings.

According to an embodiment of the present invention, a semiconductor device includes: a charge pump circuit having a plurality of booster units which are connected in series between an input terminal and an output terminal so as to boost a voltage supplied to the input terminal according to a clock signal, each of the plurality of booster units including: an internal input terminal; an internal output terminal; a main transistor that is diode-connected so as to cause a forward current to flow in a direction from the internal input terminal toward the internal output terminal; a sub-transistor that is connected between a first terminal of the main transistor and a back-gate terminal of the main transistor and that has a control terminal connected to a second terminal of the main transistor; a resistor that connects the second terminal of the main transistor and the back-gate terminal of the main transistor; and a capacitor that is connected between the internal output terminal and a clock wire to which a clock signal is supplied.

The device of the embodiment may be expressed as a method and a system, and the method and the system also fall within the scope of the present invention.

According to the embodiment, it is possible to improve the boosting performance such as a boosting time and a boosted voltage.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
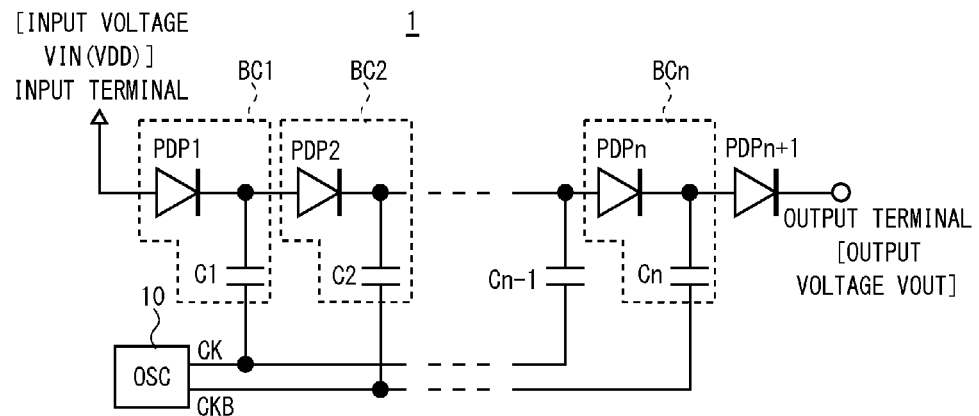
FIG. 1 is a block diagram of a semiconductor device according to a first embodiment.

For clarity of explanation, the following description and the drawings are omitted and simplified as appropriate. In the respective drawings, the same elements are denoted by the same reference numerals, and redundant description thereof will not be provided as necessary.

First Embodiment

FIG. 1 illustrates a block diagram of a semiconductor device 1 according to a first embodiment. The semiconductor device 1 according to the first embodiment has a charge pump circuit formed on a semiconductor chip. FIG. 1 illustrates the charge pump circuit. As illustrated in FIG. 1, the semiconductor device 1 according to the first embodiment includes an oscillator 10, booster units BC1 to BCn, and a rectifying device PDPn+1. Here, n is an integer indicating the number of units or devices.

The booster units BC1 to BCn are connected in series between an input terminal and an output terminal. The booster units BC1 to BCn boost an input voltage VIN supplied to the input terminal according to clock signals CK and CKB to output an output voltage VOUT. The semiconductor device 1 according to the first embodiment has the rectifying device PDPn+1 disposed between the last-stage booster unit BCn and the output terminal. The rectifying device PDPn+1 prevents backflow of current from a smoothing capacitor (not illustrated) connected to the output terminal toward the booster unit BCn. The oscillator 10 supplies the first clock signal CK to the capacitors of odd-numbered booster units among the plurality of booster units and supplies the second clock signal CKB having a phase opposite to that of the first clock signal to the capacitors of even-numbered booster units.

The booster units BC1 to BCn each have a rectifying device (for example, PDP1 to PDPn) and a capacitor (for example, C1 to Cn). In the semiconductor device 1 according to the first embodiment, a circuit that includes a main transistor, a sub-transistor, and a resistor is used as the rectifying device. Details of the rectifying device will be described later. Moreover, the rectifying devices PDP1 to PDPn are sometimes referred to as a rectifying device PDP.

The capacitor in the booster unit has one end connected to an output terminal side (for example, a cathode side of a diode-connected transistor) of the rectifying device and the other end supplied with a clock signal. Here, the clock signal CK is supplied to the other end of the capacitors of odd-numbered booster units via a clock wire, and the clock signal CKB is supplied to the other end of the capacitors of even-numbered booster units via a clock wire.

Figure 2:
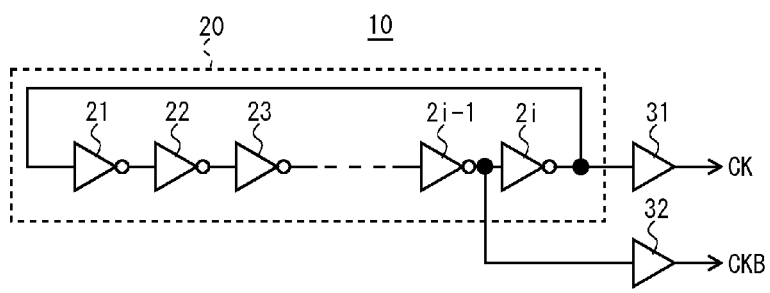
FIG. 2 is a block diagram of an oscillator according to the first embodiment.

Next, the oscillator 10 according to the first embodiment will be described in detail. FIG. 2 illustrates a block diagram of an oscillator of the semiconductor device 1 according to the first embodiment. As illustrated in FIG. 2, the oscillator 10 according to the first embodiment includes an oscillating unit 20 and clock buffers 31 and 32. The oscillator 10 is a ring oscillator in which inverters 21 to 2$i$ (i is an integer indicating the number of inverters) are connected in a loop form. The clock buffer 31 is connected to an output terminal of the inverter 2$i$ disposed at the last stage. Moreover, the clock buffer 32 is connected to the output terminal of the inverter 2$i$-1 disposed immediately before the last stage. The clock signal output from the clock buffer 31 is used as the first clock signal CK and the clock signal output from the clock buffer 32 is used as the second clock signal CKB.

Figure 3:
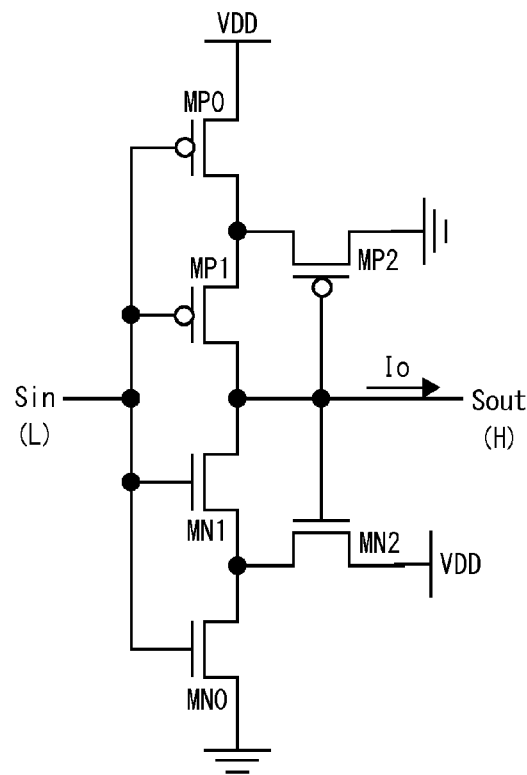
FIG. 3 is a circuit diagram of an inverter of the oscillator according to the first embodiment.

Here, the oscillator 10 according to the first embodiment operates using the input voltage VIN as a supply voltage. This input voltage VIN is output from a weak power source having a voltage value of approximately 0.1 V to 0.2 V, for example. Thus, the oscillator 10 uses an inverter circuit that can operate with a low supply voltage. FIG. 3 illustrates a circuit diagram of an example of an inverter serving as the inverters 21 to 2$i$ of the oscillator 10.

As illustrated in FIG. 3, the inverter includes PMOS transistors MP0 to MP2 and NMOS transistors MN0 to MN2. The PMOS transistors MP0 and MP1 and the NMOS transistors MN0 and MN1 are connected in series between a power source terminal and a ground terminal. More specifically, the PMOS transistors MP0 and MP1 and the NMOS transistors MN0 and MN1 are arranged such that the PMOS transistors MP0 and MP1 and the NMOS transistors MN1 and MN0 are arranged in that order from the power source terminal toward the ground terminal. Moreover, an input signal Sin is input to the gates of the PMOS transistors MP0 and MP1 and the NMOS transistors MN0 and MN1. Moreover, the node between the PMOS transistor MP1 and the NMOS transistor MN1 is an output terminal, and an output signal Sout is output from this terminal.

The PMOS transistor MP1 is connected between the ground terminal and the node between the PMOS transistor MP0 and the PMOS transistor MP1. Moreover, the gate of the PMOS transistor MP1 is connected to the output terminal of the inverter. The NMOS transistor MN1 is connected between the power source terminal and the node between the NMOS transistor MN0 and the NMOS transistor MN1. Further, the gate of the NMOS transistor MN1 is connected to the output terminal of the inverter.

In the inverter illustrated in FIG. 3, since the PMOS transistor MP2 and the NMOS transistor MP0 are added, current flows so that a leak current has no influence on an output current Io when the PMOS transistor MP0 and the NMOS transistor MN0 are turned off. Thus, in the inverter illustrated in FIG. 3, the ratio of the output current Io to an input current (for example, the current flowing from the power source terminal or the current flowing into the ground terminal) is high in a low supply voltage state, in particular. That is, the inverter illustrated in FIG. 3 can increase the response time of the change in signal level even when the supply voltage is low.

Figure 4:
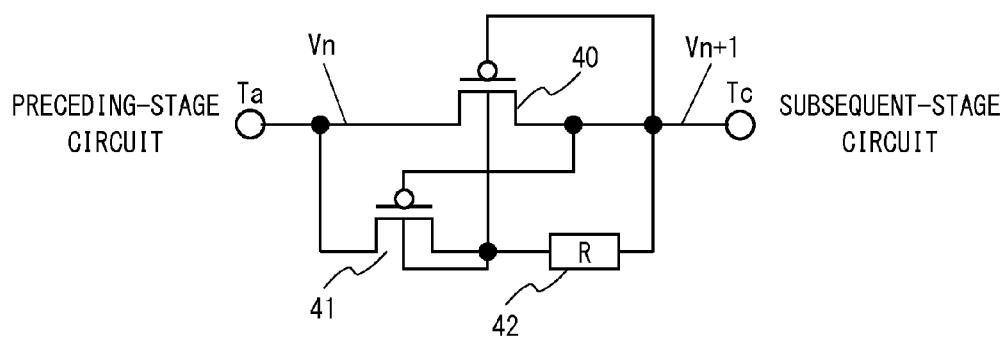
FIG. 4 is a block diagram of a rectifying device according to the first embodiment.

Next, the rectifying device of the semiconductor device 1 according to the first embodiment will be described in detail. FIG. 4 illustrates a circuit diagram of a rectifying device PDP of the semiconductor device 1 according to the first embodiment. Since the rectifying devices PDP1 to PDPn+1 are the same circuit, the circuit of the rectifying device PDPn is illustrated in FIG. 4.

As illustrated in FIG. 4, the rectifying device PDPn according to the first embodiment includes a main transistor 40, a sub-transistor 41, a resistor 42, an internal input terminal Ta, and an internal output terminal Tc. The internal input terminal Ta is a transistor connected to a preceding-stage circuit. The internal output terminal Tc is a terminal connected to a subsequent-stage circuit. Moreover, the internal output terminal Tc is connected to the other end of the capacitor Cn of the booster unit BCn illustrated in FIG. 1.

The main transistor 40 and the sub-transistor 41 are PMOS transistors. The main transistor 40 has a diode-connected thereto and causes a forward current to flow in a direction from the internal input terminal Ta toward the internal output terminal Tc. That is, the main transistor 40 has a first terminal (for example, the source) connected to the internal input terminal Ta, a second terminal (for example, the drain) connected to the internal output terminal Tc, and a control terminal (for example, the gate) connected to the drain thereof. Moreover, the main transistor 40 has a back-gate terminal to which a back-gate voltage is supplied via the sub-transistor 41 and the resistor 42.

The sub-transistor 41 is connected between the source of the main transistor 40 and the back-gate terminal of the main transistor 40. More specifically, the sub-transistor 41 has a first terminal (for example, the source) connected to the source of the main transistor 40 and a second terminal (for example, the drain) connected to the back-gate terminal of the main transistor 40. The control terminal (for example, the gate) of the sub-transistor 41 is connected to the drain of the main transistor 40. The back-gate terminal of the sub-transistor 41 is connected to the drain of the sub-transistor 41.

Moreover, in the rectifying device PDPn, a back-gate wire that connects the drain of the main transistor 40 and the back-gate terminal of the main transistor 40 is provided and the resistor 42 is provided on the back-gate wire. This resistor 42 is formed of polysilicon, for example. Moreover, the resistance value of the resistor 42 is set to be larger than a resistance value (hereinafter referred to as an ON-resistance) between the source and the drain in the ON state of the sub-transistor 41 and smaller than a resistance value (hereinafter referred to as an OFF-resistance) between the source and the drain in the OFF state of the sub-transistor 41.

Figure 5:
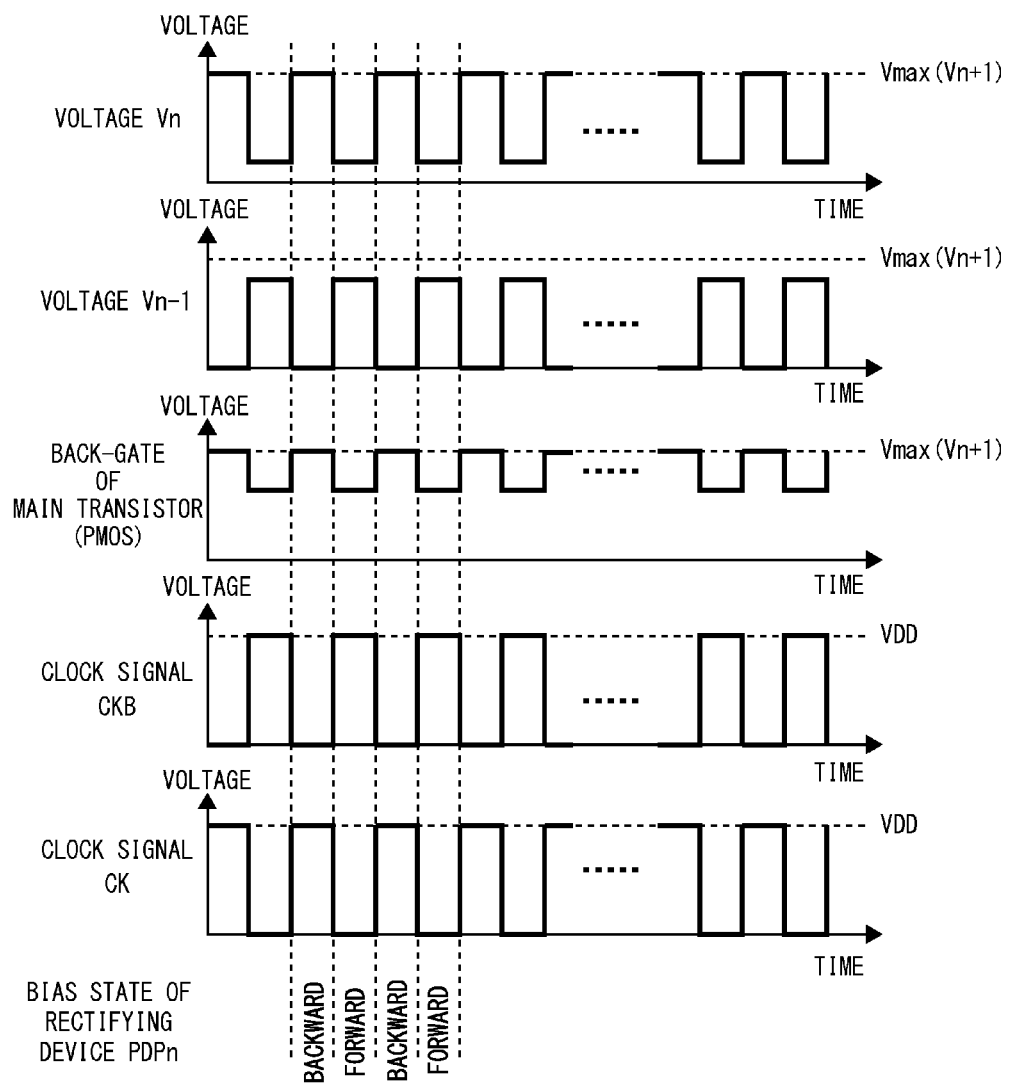
FIG. 5 is a timing chart for describing a bias state of a rectifying device during operation of the semiconductor device according to the first embodiment.

Next, the operation of the semiconductor device 1 according to the first embodiment will be described. First, a bias state of the rectifying device PDPn according to the first embodiment will be described. FIG. 5 illustrates a timing chart for describing a bias state of the rectifying device PDPn during operation of the semiconductor device according to the first embodiment. Specifically, FIG. 5 illustrates the timing chart of the rectifying device PDPn illustrated in FIG. 1.

As illustrated in FIG. 5, in the semiconductor device 1 according to the first embodiment, the rectifying device PDPn repeats a forward bias state and a backward bias state according to switching of the logical level of the clock signals CK and CKB.

In the period of the forward bias state, the clock CKB is high and a high-level clock signal is input to one end of the capacitor Cn-1. Moreover, in this period, the clock CK is Low and a low-level clock signal is input to one end of the capacitor Cn. Thus, the voltage on the cathode side (the internal input terminal Ta side) of the rectifying device PDPn is higher than the voltage on the anode side (the internal output terminal Tc side), a forward voltage is applied to the rectifying device PDPn, and current flows from the capacitor Cn-1 toward the capacitor Cn. In this case, the sub-transistor 41 of the rectifying device PDPn is turned on. Thus, a voltage obtained by dividing the source-drain voltage of the main transistor 40 by the ON-resistance of the sub-transistor 41 and the resistance value of the resistor 42 is applied to the back-gate terminal of the main transistor 40.

In the period of the backward bias state, the clock CKB is Low and a low-level clock signal is input to one end of the capacitor Cn-1. Moreover, in this period, the clock CK is high and a high-level clock signal is input to one end of the capacitor Cn. Thus, the voltage on the cathode side (the internal input terminal Ta side) of the rectifying device PDPn is lower than the voltage on the anode side (the internal output terminal Tc side), a backward voltage is applied to the rectifying device PDPn, and the current flowing from the capacitor Cn-1 toward the capacitor Cn is blocked. In this case, the sub-transistor 41 of the rectifying device PDPn is turned off. Thus, the drain voltage of the main transistor 40 is applied to the back-gate terminal of the main transistor 40 via the resistor 42.

That is, in the rectifying device PDPn according to the first embodiment, in a forward voltage application period, the main transistor 40 enters a state closer to the forward bias state than a normal bias state (for example, a state in which the source voltage is applied to the back-gate terminal), and the current flowing into the main transistor 40 increases. On the other hand, in the rectifying device PDPn according to the first embodiment, in a backward voltage application period, since a difference between the substrate voltage and the drain voltage of the main transistor 40 becomes zero, a leak current is suppressed.

In the semiconductor device 1 according to the first embodiment, by using the rectifying device PDPn, it is possible to decrease the leak current flowing in the backward direction while increasing the current flowing in the forward direction. Thus, in the semiconductor device 1 according to the first embodiment, it is possible to improve charge transfer efficiency of the charge pump circuit and to improve boosting performance such as a boosting time and a boosted voltage.

Figure 6:
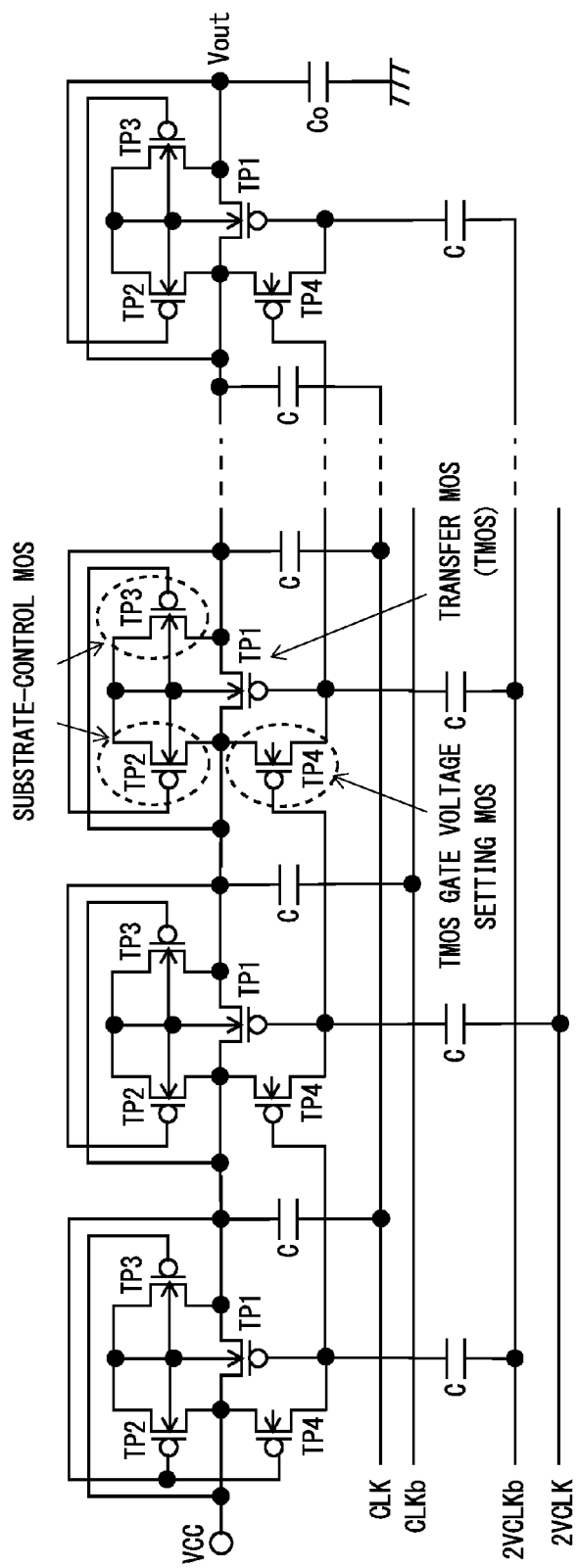
FIG. 6 is a block diagram of a semiconductor device as a comparative example of the semiconductor device according to the first embodiment.

Next, the above effect will be further explained with reference to a comparative example provided for comparison with the semiconductor device 1 according to the first embodiment. FIG. 6 illustrates a block diagram of a semiconductor device 100 as a comparative example of the semiconductor device 1 according to the first embodiment.

The semiconductor device 100 according to the comparative example illustrated in FIG. 6 is a charge pump circuit. In the semiconductor device 100 according to the comparative example, a device corresponding to the rectifying device PDPn according to the first embodiment is formed using PMOS transistors TP0 to TP3. The PMOS transistor TP1 is a transistor corresponding to the main transistor 40 of the rectifying device PDPn according to the first embodiment and is referred to as a transfer MOS transistor.

In the semiconductor device 100 according to the comparative example, the back-gate voltage of the transfer MOS is controlled using PMOS transistors TP2 and TP3. The PMOS transistors TP2 and TP3 are sometimes referred to as substrate-control MOS transistors. The PMOS transistor TP2 is turned on when a forward voltage is applied to the transfer MOS transistor and supplies the voltage of a high potential-side wire in the application state of the forward voltage to the back-gate of the transfer MOS transistor. The PMOS transistor TP3 is turned on when a backward voltage is applied to the transfer MOS transistor and supplies the voltage of a high potential-side wire in the application state of the backward voltage to the back-gate of the transfer MOS transistor.

That is, in the semiconductor device 100 according to the comparative example, the substrate-control MOS transistor is controlled so that a higher voltage among the source and drain voltages of the transfer MOS transistor is always applied to the back-gate terminal of the transfer MOS transistor. As described above, a back-gate voltage of the transistor when a forward voltage is applied to the rectifying device PDPn according to the first embodiment is different from the back-gate voltage in the semiconductor device 100 according to the comparative example. From this difference, the semiconductor device 100 according to the comparative example and the semiconductor device 1 according to the first embodiment have the following differences.

Figure 7:
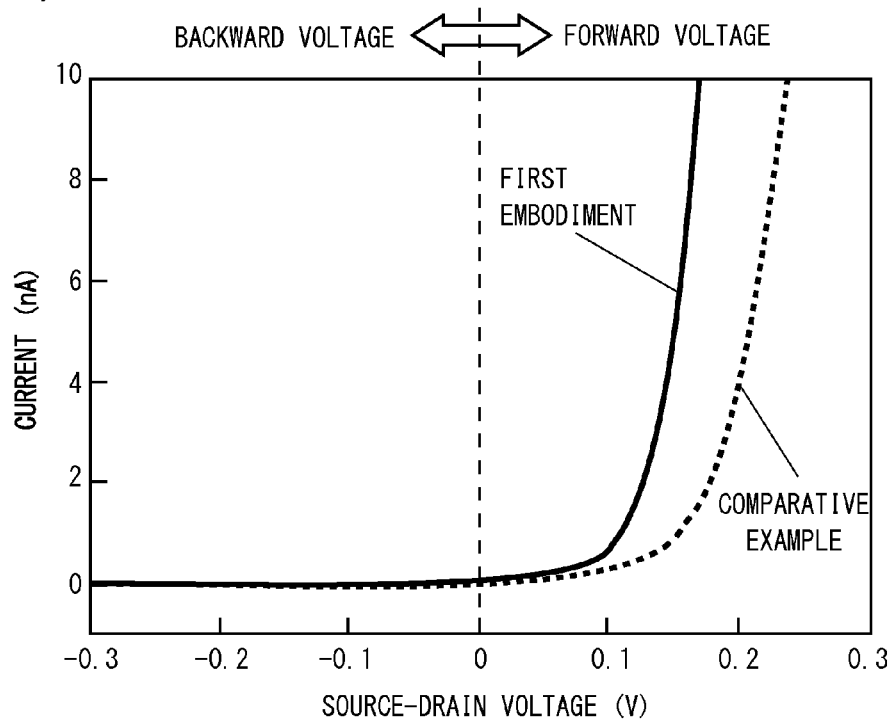
FIG. 7 is a graph for describing a difference in current characteristics between the rectifying device according to the first embodiment and a rectifying device according to the comparative example.

FIG. 7 illustrates a graph for describing a difference in current characteristics between the rectifying device according to the first embodiment and the rectifying device according to the comparative example. As illustrated in FIG. 7, in a state in which a forward voltage is applied to the rectifying device, the semiconductor device 1 according to the first embodiment can supply a larger current at a forward voltage than that of the semiconductor device 100 according to the comparative example. On the other hand, in a state in which a backward voltage is applied to the rectifying device, the semiconductor device 1 according to the first embodiment and the semiconductor device 100 according to the comparative example do not exhibit a considerable difference.

Figure 8:
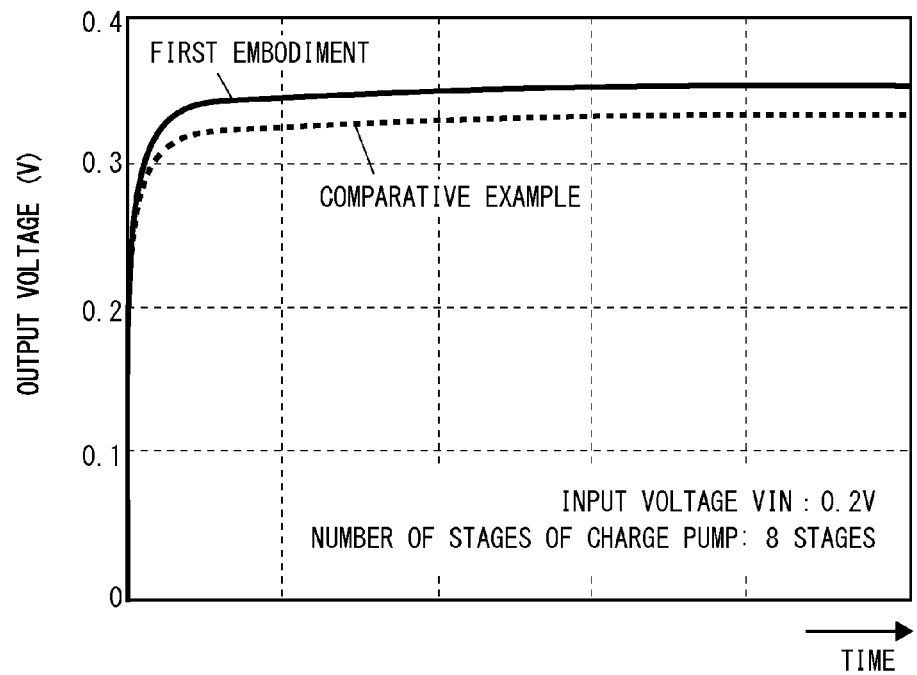
FIG. 8 is a graph for describing a difference in output characteristics between the semiconductor device according to the first embodiment and the semiconductor device according to the comparative example.

FIG. 8 illustrates a graph for describing a difference in output characteristics between the semiconductor device according to the first embodiment and the semiconductor device according to the comparative example. In the example of FIG. 8, the input voltage VIN is 0.2 V and the number n of stages of the charge pump circuit is 8. As illustrated in FIG. 8, when the output voltage is increased up to approximately 0.32 V, for example, the semiconductor device 1 according to the first embodiment can boost the output voltage faster than the semiconductor device 100 according to the comparative example. Moreover, when the maximum boosted voltage is compared, the semiconductor device 1 according to the first embodiment can increase the output voltage up to a voltage approximately 10% higher than that of the semiconductor device 100 according to the comparative example.

As described above, by using the rectifying device PDPn according to the first embodiment, it is possible to improve boosting performance such as boosting time and a boosted voltage of the charge pump circuit.

Figure 9:
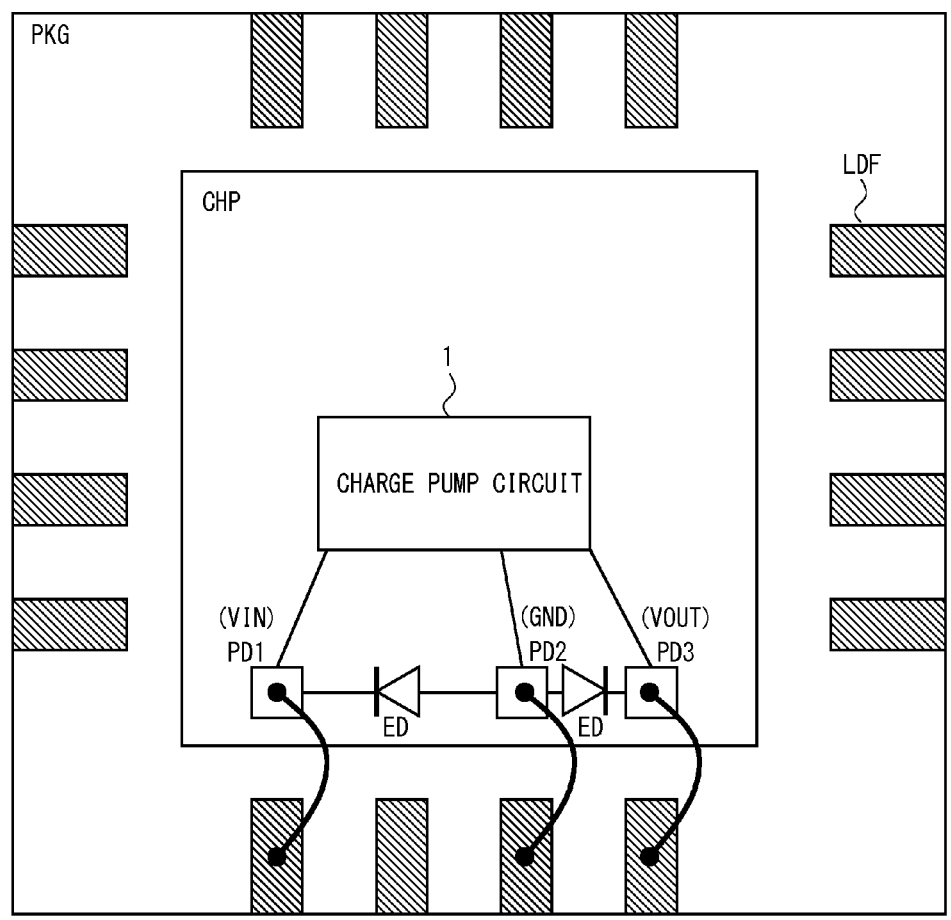
FIG. 9 is a diagram for describing a layout of the semiconductor device according to the first embodiment.

Next, a layout of the semiconductor device 1 according to the first embodiment will be described. FIG. 9 illustrates a diagram for describing the layout of the semiconductor device according to the first embodiment. FIG. 9 illustrates a charge pump circuit 1 as the semiconductor device 1. The charge pump circuit 1 is formed on a semiconductor chip CHP. Moreover, pads PD1 to PD3 are formed on the semiconductor chip CHP. The charge pump circuit 1 is connected to the pads PD1 to PD3 by on-chip wires. Moreover, the pads PD1 to PD3 are connected to a lead frame LDF of a semiconductor package PKG on which the semiconductor chip CHP is mounted by wires. Moreover, an electrostatic breakdown protection diode ED is formed on the semiconductor chip CHP. The electrostatic breakdown protection diode ED has an anode connected to the pad PD2 to which a ground voltage GND is applied and a cathode connected to another pad.

Figure 10:
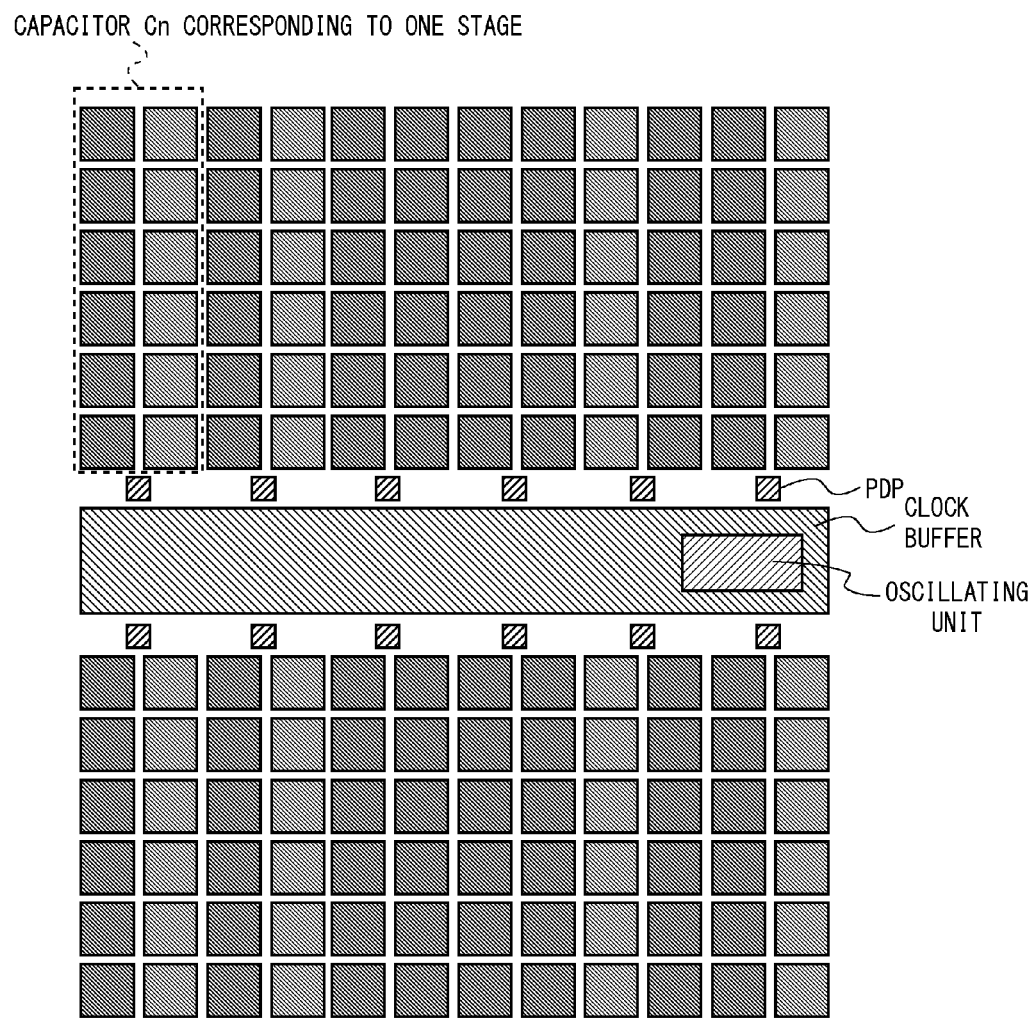
FIG. 10 is a diagram for describing a layout of a charge pump circuit according to the first embodiment.

Next, the layout of the charge pump circuit according to the first embodiment will be described. FIG. 10 illustrates a diagram for describing the layout of the charge pump circuit according to the first embodiment. FIG. 10 illustrates an example of the layout of a charge pump circuit only. In the example of FIG. 10, the number n of stages of the charge pump circuit is 12. As illustrated in FIG. 10, the charge pump circuit according to the first embodiment has rectifying devices PDP and capacitors Cn which are symmetrically disposed on both sides of a formation region of the oscillator 10 in which the clock buffer and the oscillating unit 20 of the oscillator 10 are disposed. Moreover, a capacitor corresponding to one stage of the booster unit is formed by combining ten capacitors. Here, the layout of the rectifying device PDP will be described in further detail.

Figure 11:
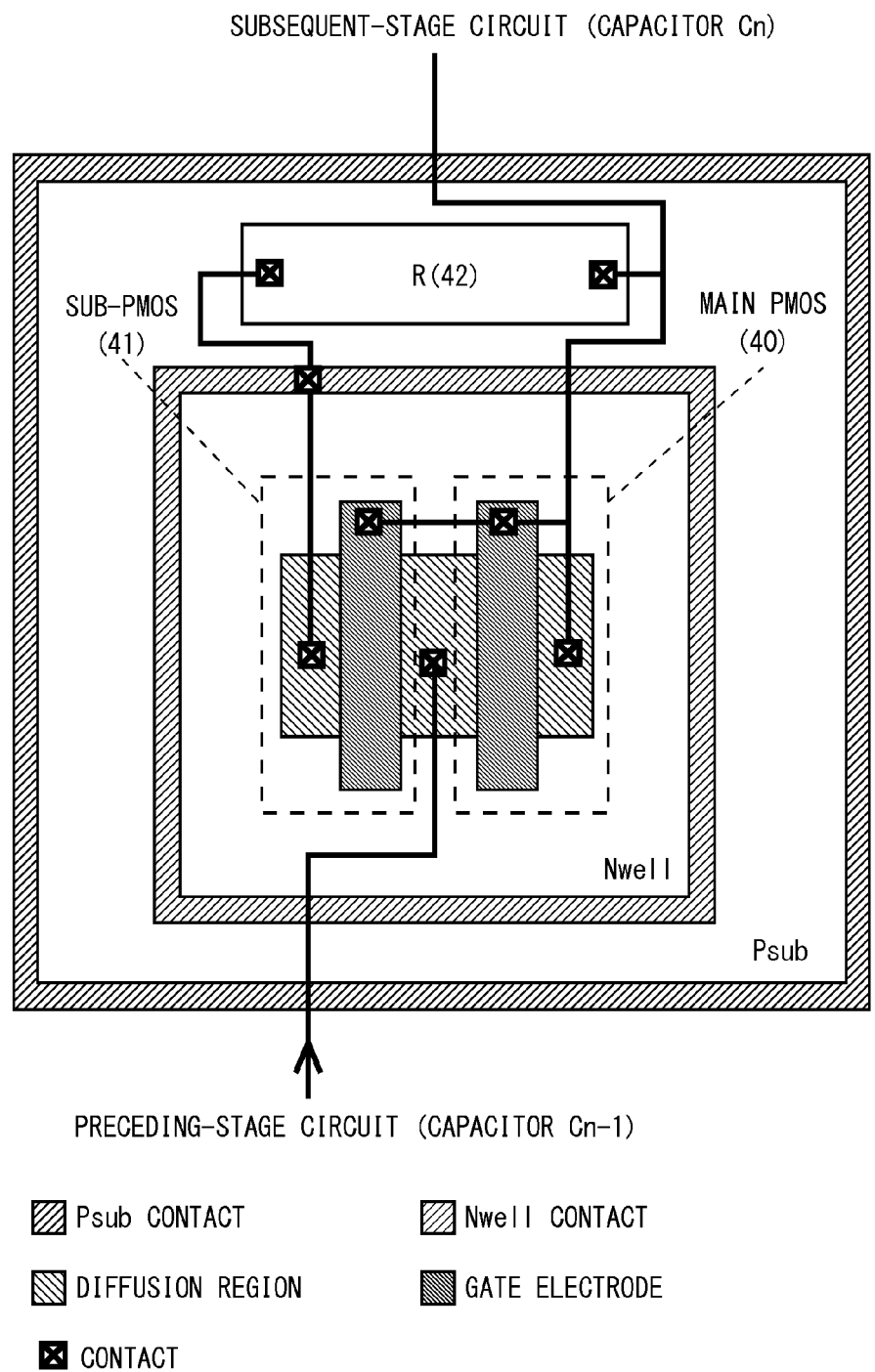
FIG. 11 is a diagram for describing a layout of the rectifying device according to the first embodiment.

FIG. 11 illustrates a diagram for describing the layout of the rectifying device PDP according to the first embodiment. As illustrated in FIG. 11, the rectifying device PDP according to the first embodiment includes the resistor 42 formed in a semiconductor substrate Psub and the main transistor 40 and the sub-transistor 41 formed on an N-well formed in the semiconductor substrate Psub. A Psub contact is formed in the semiconductor substrate Psub, and the ground voltage is supplied to the semiconductor substrate Psub via the Psub contact. Moreover, an N-well contact serving as the back-gate terminals of the main transistor 40 and the sub-transistor 41 is formed around the N-well, and the back-gate voltages of the main transistor 40 and the sub-transistor 41 are supplied via the N-well contact.

The main transistor 40 and the sub-transistor 41 have a diffusion region and a gate electrode. Moreover, the source of the main transistor 40 and the source of the sub-transistor 41 are formed in a common diffusion region. Wires from the preceding-stage circuit are connected to the common diffusion region. The drain of the sub-transistor 41, the N-well contact, and one end of the resistor 42 are connected by a wire that electrically connects these terminals. Moreover, the gate of the main transistor 40, the gate of the sub-transistor 41, the drain of the main transistor 40, and the other end of the resistor 42 are connected by a wire that electrically connects these terminals. Moreover, the capacitor Cn of the booster unit BCn and a wire connected to the subsequent-stage circuit are connected from the other end of the resistor 42.

Figure 12:
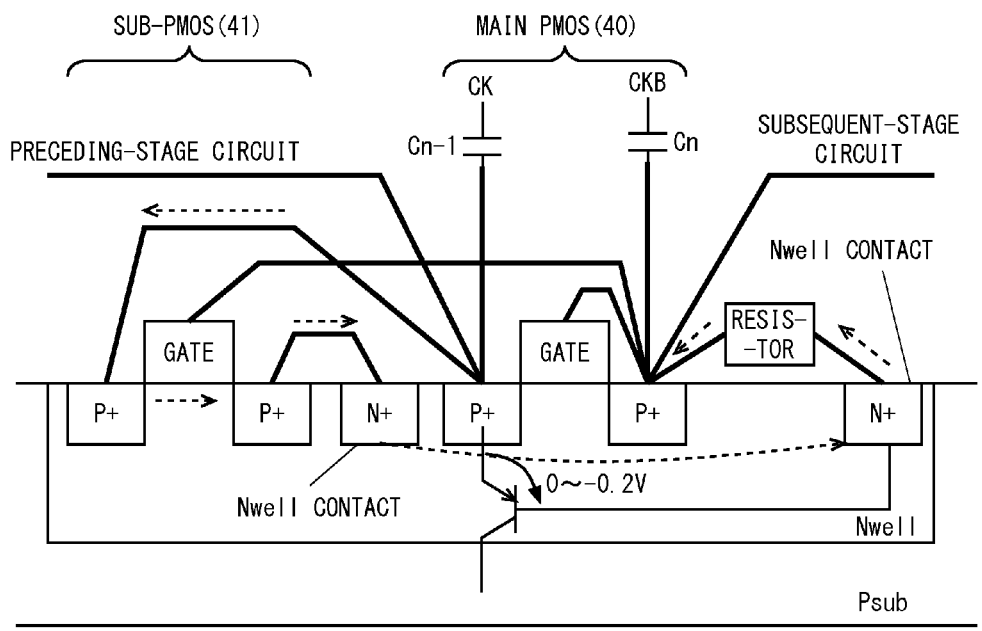
FIG. 12 is a diagram for describing a vertical structure of the rectifying device according to the first embodiment.

Next, a parasitic transistor in the rectifying device PDP according to the first embodiment and the rectifying device according to the comparative example will be described. FIG. 12 illustrates a diagram for describing a vertical structure of the rectifying device according to the first embodiment, and FIG. 13 illustrates a diagram for describing a vertical structure of the rectifying device according to the comparative example.

As illustrated in FIG. 12, the rectifying device PDP according to the first embodiment has the N-well formed on the semiconductor substrate Psub. Moreover, a P+ region serving as a diffusion region of the main transistor 40 and the sub-transistor 41 and an N+ region serving as the N-well contact are formed in the N-well. Further, the gate electrodes and the resistor 42 are formed on the N-well. In the rectifying device PDP according to the first embodiment, a PNP transistor of which the emitter is the source of the main transistor 40, the base is the N-well, and the collector is the semiconductor substrate Psub is formed as a parasitic transistor.

However, in the rectifying device PDP according to the first embodiment, in a state in which a forward voltage is applied to the rectifying device, the base-emitter voltage of the parasitic transistor is approximately −0.2 V or lower regardless of the value of the forward voltage. Thus, in a state in which a backward voltage is applied, since the base-emitter voltage of the parasitic transistor is approximately 0 V, the parasitic transistor will not be turned on. If the resistor 42 is not present, in a state in which a large forward voltage is applied to the rectifying device, since the base-emitter voltage of the parasitic transistor may reach approximately −0.5 V or higher, the parasitic transistor may be turned on.

Figure 13:
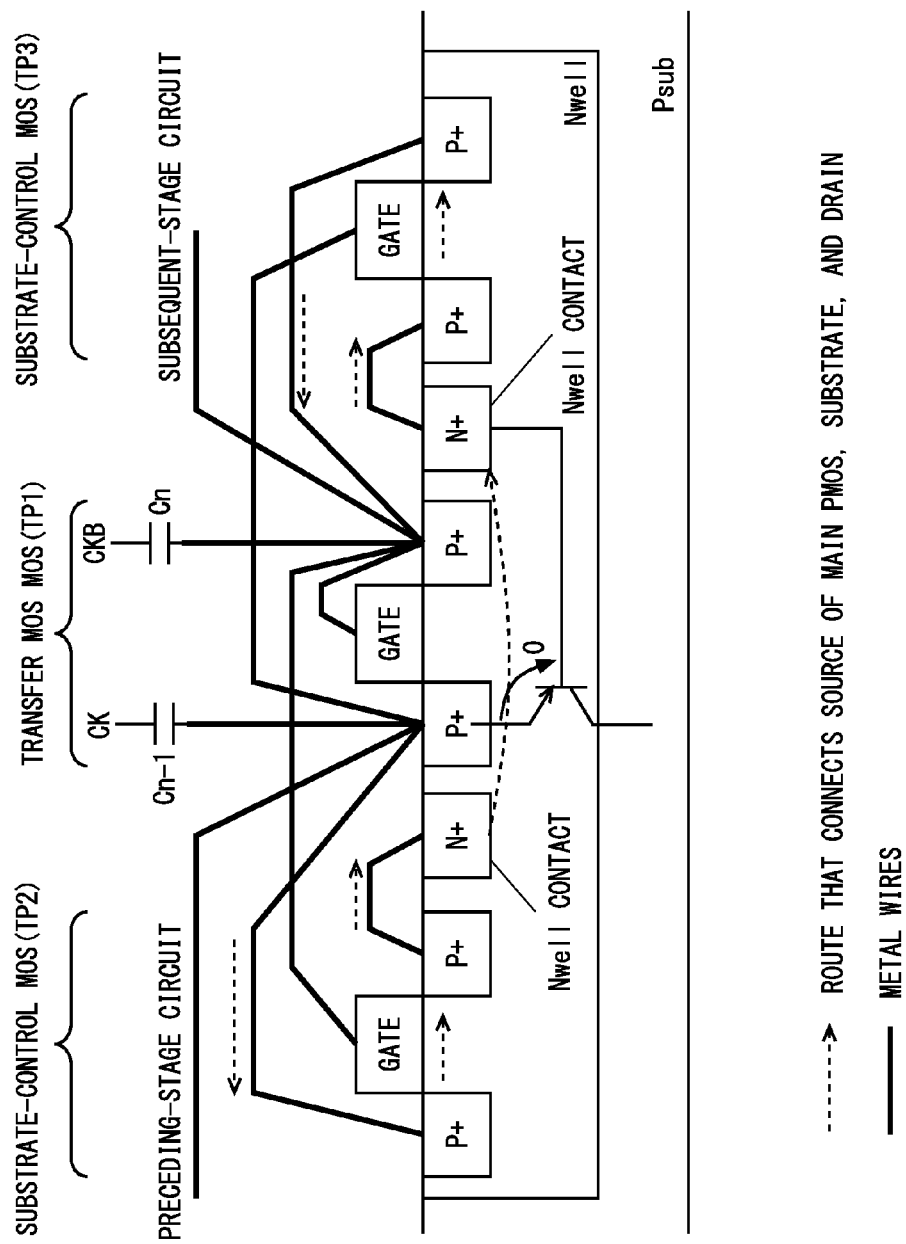
FIG. 13 is a diagram for describing a vertical structure of the rectifying device according to the comparative example.

As illustrated in FIG. 13, the rectifying device according to the comparative example has such a vertical structure that the resistor of the rectifying device according to the first embodiment illustrated in FIG. 12 is replaced with a PMOS transistor TP3. In the rectifying device according to the comparative example, a PNP transistor of which the emitter is the source of the PMOS transistor TP3, the base is the N-well, and the collector is the semiconductor substrate Psub is formed as a parasitic transistor.

However, in the rectifying device according to the comparative example, in both a state in which a forward voltage is applied to the rectifying device and a state in which a backward voltage is applied to the rectifying device, since the base-emitter voltage of the parasitic transistor is 0 V, the parasitic transistor will not be turned on.

Here, the rectifying device PDP according to the first embodiment will be discussed. As described in FIG. 12, in the rectifying device PDP according to the first embodiment, it is important to prevent activation of the parasitic transistor. In the rectifying device PDP according to the first embodiment, a voltage state in which the back-gate voltage of the main transistor 40 is applied can be switched by the sub-transistor 41 and the resistor 42. In particular, in the rectifying device PDP according to the first embodiment, the substrate bias is maintained substantially at zero in a state in which a backward voltage is applied while maintaining the substrate bias at a forward bias in a state in which a forward voltage is applied. Thus, in the rectifying device PDP according to the first embodiment, the relation between the resistance value of the sub-transistor 41 and the resistance value of the resistor 42 for maintaining the bias state at 0 V in a state in which a backward voltage is applied while maintaining the parasitic transistor at an inactive state in a state in which a forward voltage is applied is important.

The resistance value of the sub-transistor 41 is approximately between 1 kΩ and 100 kΩ when the sub-transistor 41 is in an ON state in which current flows from the source to the drain when fluctuation of the resistance value is taken into consideration. The sub-transistor 41 is turned on when a forward voltage is applied to the rectifying device PDP. Here, in a state in which a forward voltage is applied to the rectifying device PDP, in order to prevent activation of a parasitic bipolar transistor due to application of an excessive forward bias as the back-gate voltage of the main transistor 40, the resistance value of the resistor 42 needs to be set to be larger than the ON-resistance of the sub-transistor 41.

On the other hand, the resistance value of the sub-transistor 41 is 100 MΩ or higher when the sub-transistor 41 is in an OFF state in which the current flowing from the source to the drain is blocked when fluctuation of the resistance value is taken into consideration. The sub-transistor 41 is turned off when a backward voltage is applied to the rectifying device PDP. Here, in a state in which a backward voltage is applied to the rectifying device PDP, in order to apply a voltage close to the drain voltage of the sub-transistor 41 as the back-gate voltage of the main transistor 40, the resistance value of the resistor 42 needs to be set to be smaller than the OFF-resistance of the sub-transistor 41.

The resistance value R of the resistor 42 satisfies the relation: OFF-resistance of sub-transistor 41 (for example, 100 MΩ or higher)>>Resistance value R>>ON-resistance of sub-transistor 41 (for example, 1 kΩ to 100 kΩ). That is, the resistance value of the resistor 42 is preferably approximately several hundreds of kΩ.

As described above, in the semiconductor device 1 according to the first embodiment, by using the rectifying device PDP described with reference to FIG. 4, it is possible to decrease a leak current in a state in which a backward voltage is applied while increasing the current flowing in a state in which a forward voltage is applied. By using a charge pump circuit in which booster units BC having the rectifying device PDP according to the first embodiment are connected in series, it is possible to improve the boosting performance such as boosting time and a boosted voltage of the charge pump circuit. In particular, when a power source that supplies the input voltage VIN is a weak power source of which the highest output voltage is lower than the lowest operating supply voltage of a load circuit that the semiconductor device 1 supplies power, the input voltage VIN has a small margin to the voltage at which transistors can operate. In this case, the effect of increasing the current flowing into the rectifying device PDP and decreasing the leak current of the rectifying device PDP is remarkable.

Moreover, in the semiconductor device 1 according to the first embodiment, by setting the resistance value of the resistor 42 in the rectifying device PDP to several hundreds of kΩ, it is possible to suppress activation of a parasitic transistor formed on the layout of the rectifying device PDP.

Further, in the semiconductor device 1 according to the first embodiment, the oscillating unit 20 of the oscillator 10 is realized using the inverter (for example, a Schmitt trigger logic inverter) described with reference to FIG. 3. Due to this, in the semiconductor device 1 according to the first embodiment, it is possible to operate the oscillating unit 20 using the low input voltage VIN. That is, the semiconductor device 1 can generate a high output voltage based on the low input voltage VIN using the Schmitt trigger logic inverter illustrated in FIG. 3.

Second Embodiment

Figure 14:
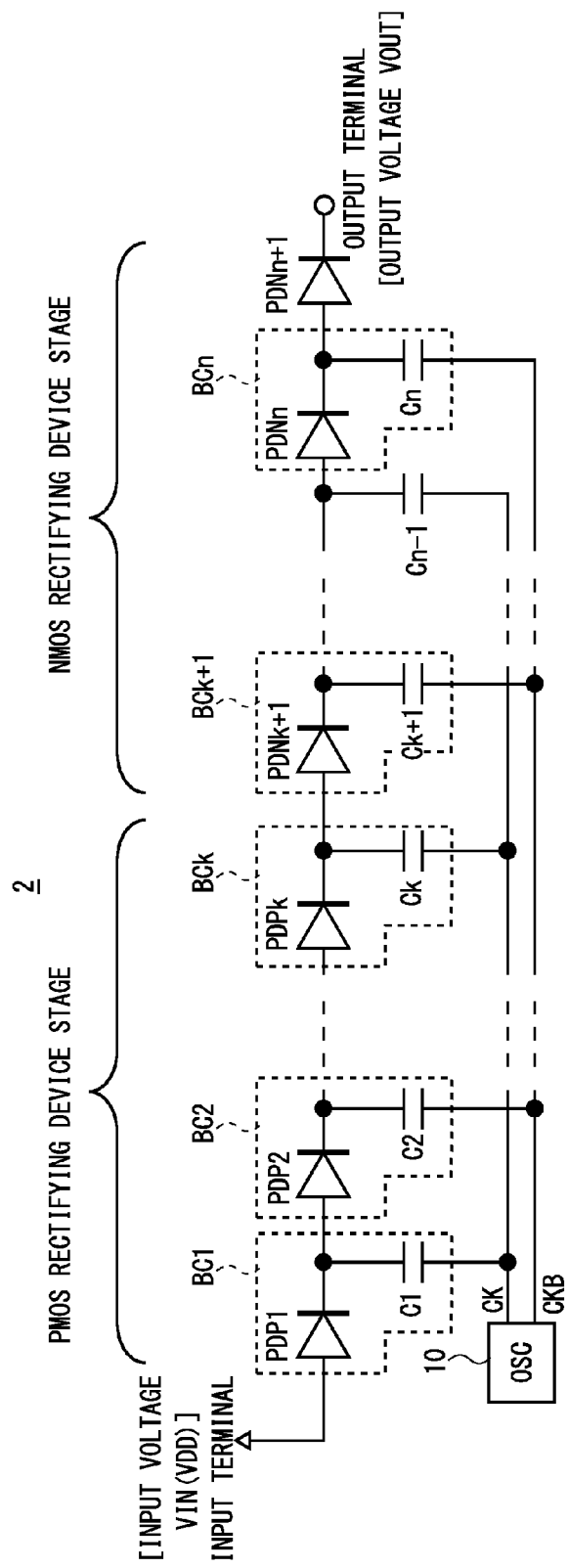
FIG. 14 is a block diagram of a semiconductor device according to a second embodiment.

In a second embodiment, a semiconductor device 2 as another embodiment of the semiconductor device 1 according to the first embodiment will be described. FIG. 14 illustrates a block diagram of the semiconductor device 2 according to the second embodiment. As illustrated in FIG. 14, two types of rectifying devices are used in the second embodiment. In the example of FIG. 14, the semiconductor device 2 according to the second embodiment uses booster units having a rectifying device which uses a PMOS transistor as a main transistor is used as a first booster unit group made up of booster units of the first to k-th stages (k is an integer indicating the stage number of a booster unit) as counted from the input terminal side among n stages of booster units. Moreover, the semiconductor device 2 according to the second embodiment uses booster units having a rectifying device which uses a NMOS transistor as a main transistor as a second booster unit group made up of booster units of the k+1 to n-th stages as counted from the input terminal side among the n stages of booster units. In FIG. 14, the rectifying device which uses a NMOS transistor as a main transistor is denoted by PDN. In the semiconductor device 2 according to the second embodiment, a rectifying device which uses a NMOS transistor as a main transistor is also used as the rectifying device connected to the output terminal.

Since the rectifying device which uses a PMOS transistor as a main transistor is the same as the rectifying device according to the first embodiment, description thereof will not be provided. The rectifying device PDN which uses a NMOS transistor as a main transistor will be described in detail.

Figure 15:
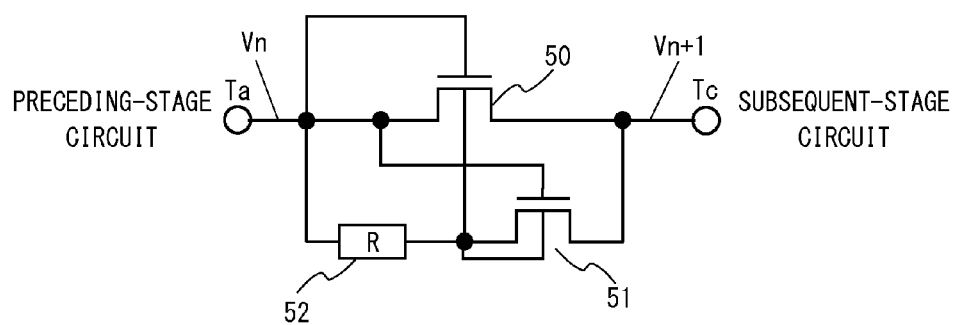
FIG. 15 is a block diagram of a rectifying device according to the second embodiment, with this rectifying device using an N-type semiconductor transistor.

FIG. 15 illustrates a circuit diagram of the rectifying device PDN according to the second embodiment. As illustrated in FIG. 15, a rectifying device PDNn according to the second embodiment includes a main transistor 50, a sub-transistor 51, a resistor 52, an internal input terminal Ta, and an internal output terminal Tc. The internal input terminal Ta is a terminal connected to a preceding-stage circuit. The internal output terminal Tc is a terminal connected to a subsequent-stage circuit. Moreover, the internal output terminal Tc is connected to the other end of a capacitor Cn of a booster unit BCn illustrated in FIG. 14.

The main transistor 40 and the sub-transistor 41 are NMOS transistors. The main transistor 50 has a diode-connected thereto and causes a forward current to flow in a direction from the internal input terminal Ta toward the internal output terminal Tc. That is, the main transistor 50 has a first terminal (for example, the source) connected to the internal output terminal Tc, a second terminal (for example, the drain) connected to the internal input terminal Ta, and a control terminal (for example, the gate) connected to the drain. Moreover, the main transistor 50 has a back-gate terminal to which a back-gate voltage is supplied via the sub-transistor 51 and the resistor 52.

The sub-transistor 51 is connected between the source of the main transistor 50 and the back-gate terminal of the main transistor 50. More specifically, the sub-transistor 51 has a first terminal (for example, the source) connected to the source of the main transistor 50 and a second terminal (for example, the drain) connected to the back-gate terminal of the main transistor 50. The control terminal (for example, the gate) of the sub-transistor 51 is connected to the drain of the main transistor 50. The back-gate terminal of the sub-transistor 51 is connected to the drain of the sub-transistor 51.

Moreover, in the rectifying device PDNn, a back-gate wire that connects the drain of the main transistor 50 and the back-gate terminal of the main transistor 50 is provided and the resistor 52 is provided on the back-gate wire. This resistor 52 is formed of polysilicon, for example. Moreover, the resistance value of the resistor 52 is set to be larger than the ON-resistance of the sub-transistor 51 and smaller than the OFF-resistance of the sub-transistor 41.

As illustrated in FIG. 15, in the rectifying device PDN according to the second embodiment, the gates of the main transistor 50 and the sub-transistor 51 are connected to the input terminal side, but the gates of the main transistor 50 and the sub-transistor 51 are not connected to the output terminal side. On the other hand, in the rectifying device PDP according to the first embodiment, as described with reference to FIG. 4, the gates of the main transistor 50 and the sub-transistor 51 are not connected to the input terminal side, but the gates of the main transistor 50 and the sub-transistor 51 are connected to the output terminal side. Transistors have low breakdown resistance against static electricity applied to the gate. Thus, in the semiconductor device 2 according to the second embodiment, the rectifying device PDP which uses a PMOS transistor as a main transistor is disposed at a position where transistors are connected directly to the input terminal, and the rectifying device PDN which uses a NMOS transistor as a main transistor is disposed at a position where transistors are connected directly to the output terminal. Due to this, the semiconductor device 2 according to the second embodiment can increase the resistance against electrostatic breakdown of the semiconductor device as compared to when the rectifying device PDP according to the first embodiment is used as a device which is connected directly to the output terminal.

In the semiconductor device 2, since the charge pump circuit has high resistance against electrostatic breakdown, it is possible to decrease the capability of the electrostatic breakdown protection diode ED. The electrostatic breakdown protection diode ED has such characteristics that the higher the protecting capability, the larger the device size and the larger the leak current. Therefore, by decreasing the capability of the electrostatic breakdown protection diode ED, the semiconductor device 2 according to the second embodiment can decrease the chip size. Moreover, by decreasing the capability of the electrostatic breakdown protection diode ED, the semiconductor device 2 according to the second embodiment can decrease the leak current occurring in the electrostatic breakdown protection diode ED and improve the boosting performance such as a boosting time and a boosted voltage of the charge pump circuit. In particular, when a charge pump circuit is operated based on a low input voltage VIN, the current flowing into the rectifying device is very small, and the influence of the leak current on the boosting performance of the charge pump circuit increases. Thus, the effect of reducing the leak current is remarkable when the input voltage VIN is low.

The first booster unit group and the second booster unit group may only need to include at least one rectifying device which uses the same conductivity type, and the respective booster unit groups may not always include a plurality of rectifying devices which uses the same conductivity type.

Third Embodiment

Figure 16:
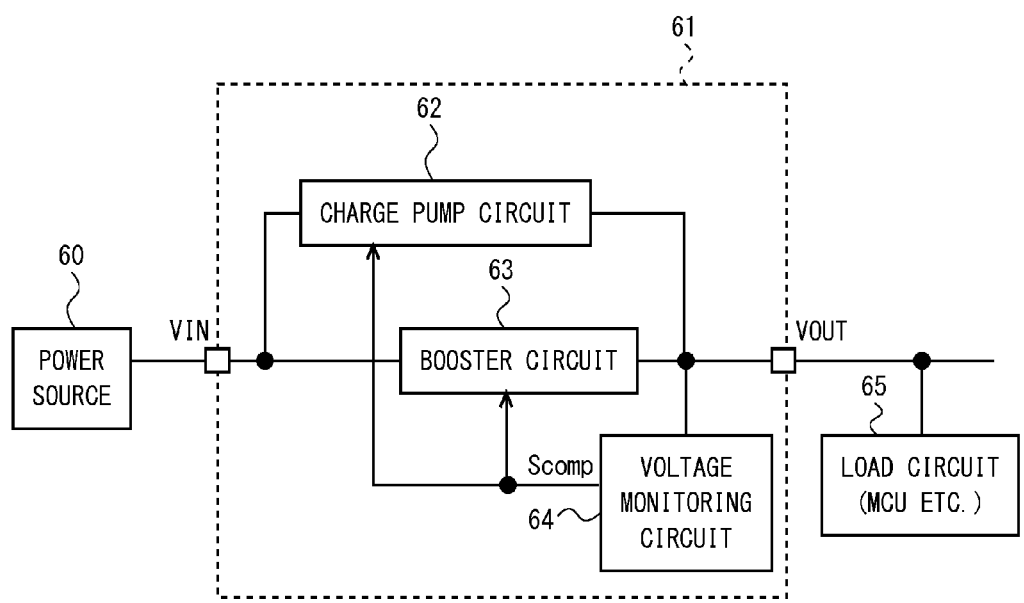
FIG. 16 is a block diagram of a semiconductor device according to a third embodiment.

In a third embodiment, an example of a semiconductor system 3 including a semiconductor device 61 in which another circuit is combined with the charge pump circuit described in the first and second embodiments will be described. FIG. 16 illustrates a block diagram of the semiconductor system 3 according to the third embodiment. As illustrated in FIG. 16, the semiconductor system 3 according to the third embodiment includes a power source 60, a semiconductor device 61, and a load circuit 65.

Figure 17:
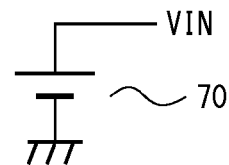
FIG. 17 is a block diagram of a power source according to the third embodiment.
Figure 17:
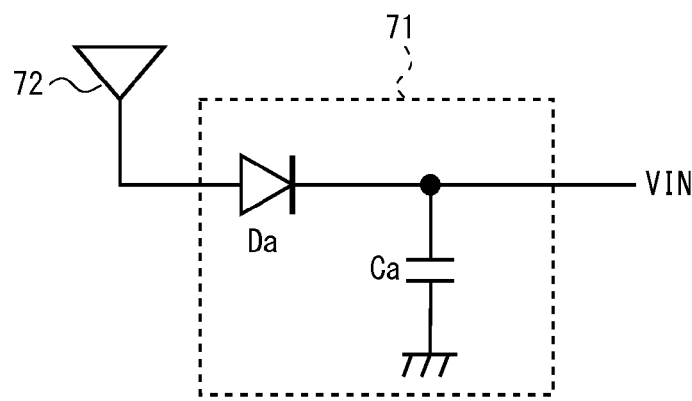
Figure 17:
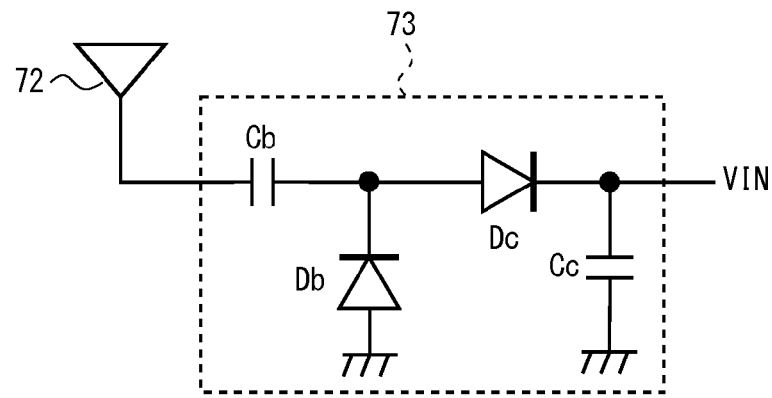

The power source 60 is a power source such as a photovoltaic battery, a thermocouple, or an energy harvester that harvests electric power from environmental electric waves. FIG. 17 illustrates examples of this power source. An example in which a power generating device 70 such as a photovoltaic battery or a thermocouple is used as the power source 60 is illustrated at the top of FIG. 17. An example in which the power source 60 includes an antenna 72 and an RF-DC conversion circuit 71 that converts RF signals obtained by the antenna 72 to a DC voltage is illustrated at the middle of FIG. 17. The RF-DC conversion circuit 71 rectifies the half waves of the RF signals obtained by the antenna 72 using a diode Da and smoothes the rectified RF signals using a capacitor Ca to obtain the DC voltage. An example in which the power source 60 includes an antenna 72 and an RF-DC conversion circuit 73 that converts RF signals obtained by the antenna 72 to a DC voltage is illustrated at the bottom of FIG. 17. The RF-DC conversion circuit 73 rectifies the full waves of the RF signals obtained by the antenna 72 using a capacitor Cb and diodes Db and Dc and smoothes the rectified RF signals using a capacitor Cc to obtain the DC voltage.

The load circuit 65 is a functional circuit such as a micro controller unit (MCU), for example, and is a circuit that operates using the output voltage VOUT output by the semiconductor device 61 as an operating voltage.

The semiconductor device 61 includes a charge pump circuit 62, a booster circuit 63, and a voltage monitoring circuit 64. The charge pump circuit 62 is the charge pump circuit described in the first and second embodiments. The booster circuit 63 is connected in parallel to the charge pump circuit 62. The booster circuit 63 is a booster circuit such as a switching regulator which has higher efficiency than the charge pump circuit, for example. The voltage monitoring circuit 64 monitors the output voltage VOUT appearing in the output terminal. The voltage monitoring circuit 64 allows the operation of the charge pump circuit 62 and suspends the booster circuit 63 in a period in which the output voltage VOUT is lower than a predetermined threshold voltage. The voltage monitoring circuit 64 suspends the charge pump circuit 62 and allows the operation of the booster circuit 63 in a period in which the output voltage is equal to or higher than the threshold voltage. More specifically, the charge pump circuit 62 and the booster circuit 63 switch between an operating state and a suspended state according to a control signal Scomp output based on the result of comparison between the output voltage and the threshold made by the voltage monitoring circuit 64.

Figure 18:
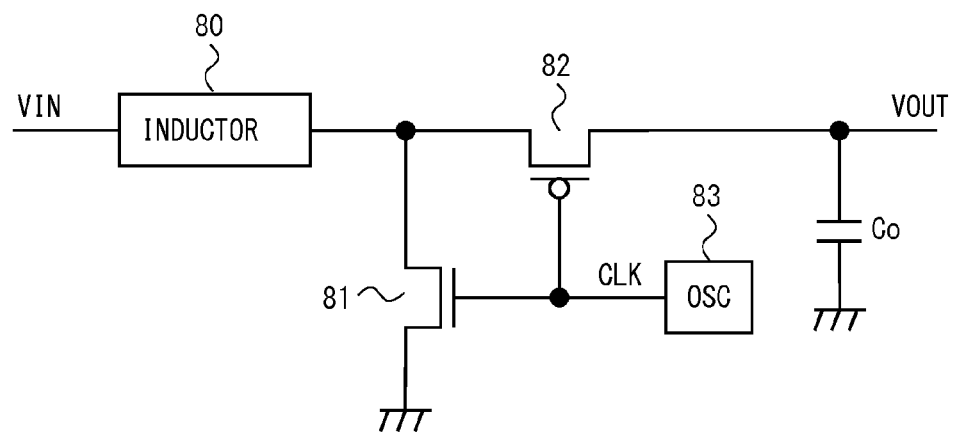
FIG. 18 is a block diagram of a booster circuit according to the third embodiment.

Here, the details of the booster circuit 63 and the voltage monitoring circuit 64 will be described. FIG. 18 illustrates a block diagram of the booster circuit 63 according to the third embodiment. As illustrated in FIG. 18, the booster circuit 63 includes an inductor 80, a NMOS transistor 81, a PMOS transistor 82, an oscillator 83, and a capacitor Co. The input voltage VIN is input to one end of the inductor 80. The other end of the inductor 80 is connected to the drain of the NMOS transistor 81 and the drain of the PMOS transistor 82. The source of the NMOS transistor 81 is connected to the ground terminal. A clock signal CLK from the oscillator 83 is input to the gate of the NMOS transistor 81. The source of the PMOS transistor 82 is connected to the output terminal. The clock signal CLK from the oscillator 83 is input to the gate of the PMOS transistor 82. The capacitor Co is connected to the output terminal and the ground terminal. The oscillator 83 operates using the output voltage VOUT as an operating supply voltage and outputs the clock signal CLK. Although not illustrated in the drawing, the control signal Scomp output by the voltage monitoring circuit 64 is input to the oscillator 83.

Figure 19:
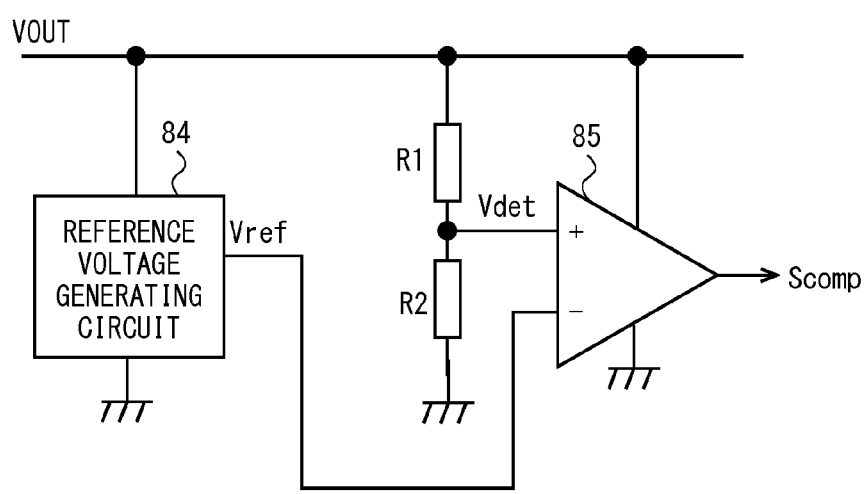
FIG. 19 is a block diagram of a voltage monitoring circuit according to the third embodiment.

FIG. 19 illustrates a block diagram of the voltage monitoring circuit 64 according to the third embodiment. As illustrated in FIG. 19, the voltage monitoring circuit 64 according to the third embodiment includes a reference voltage generating circuit 84, a comparator 85, and resistors R1 and R2. Moreover, the voltage monitoring circuit 64 operates using the output voltage VOUT as a supply voltage.

The reference voltage generating circuit 84 outputs a reference voltage Vref. The resistors R1 and R2 are connected in series between the ground terminal and an output wire to which the output voltage VOUT is supplied and are configured to output a detection voltage Vdet obtained by dividing the output voltage VOUT by the resistance values of the resistors R1 and R2. The comparator 85 compares the detection voltage Vdet and the reference voltage Vref and outputs the comparison result as the control signal Scomp. Specifically, the comparator 85 has a non-inverting input terminal to which the detection voltage Vdet is input and an inverting input terminal to which the reference voltage Vref is input. The comparator 85 switches the level of the control signal Scomp from Low to High when the detection voltage Vdet is equal to or higher than the reference voltage Vref.

Figure 20:
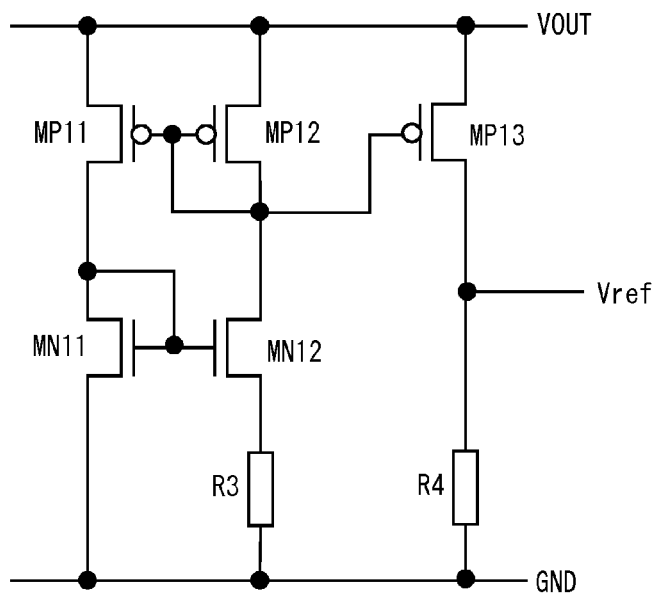
FIG. 20 is a block diagram of a reference voltage generating circuit according to the third embodiment.

Next, a specific example of the reference voltage generating circuit 84 will be described. A bandgap reference voltage source (BGR), for example, can be used as the reference voltage generating circuit 84. FIG. 20 illustrates a circuit diagram of a bandgap reference voltage source as an example of the reference voltage generating circuit 84. As illustrated in FIG. 20, the reference voltage generating circuit 84 includes PMOS transistors MP11 to MP13, NMOS transistors MN11 and MN12, and resistors R3 and R4.

The NMOS transistors MN11 and MN12 form a current mirror circuit. The NMOS transistor MN11 has a diode-connected thereto. The resistor R3 is connected between the ground terminal and the source of the NMOS transistor MN12. The PMOS transistor MP11 has a source connected to an output wire and a drain connected to the drain of the NMOS transistor MN11. The PMOS transistor MP12 has a source connected to the output wire and a drain connected to the drain of the NMOS transistor MN12. The PMOS transistor MP13 has a source connected to the output wire and a drain connected to the ground terminal via the resistor R4. Moreover, the gate of the PMOS transistor MP12 is connected to the drain of the PMOS transistor MP12 and the gate and the drain are connected in common to the gates of the PMOS transistors MP11 and MP13. The reference voltage generating circuit 84 outputs the reference voltage Vref from the node between the PMOS transistor MP13 and the resistor R4.

Figure 21:
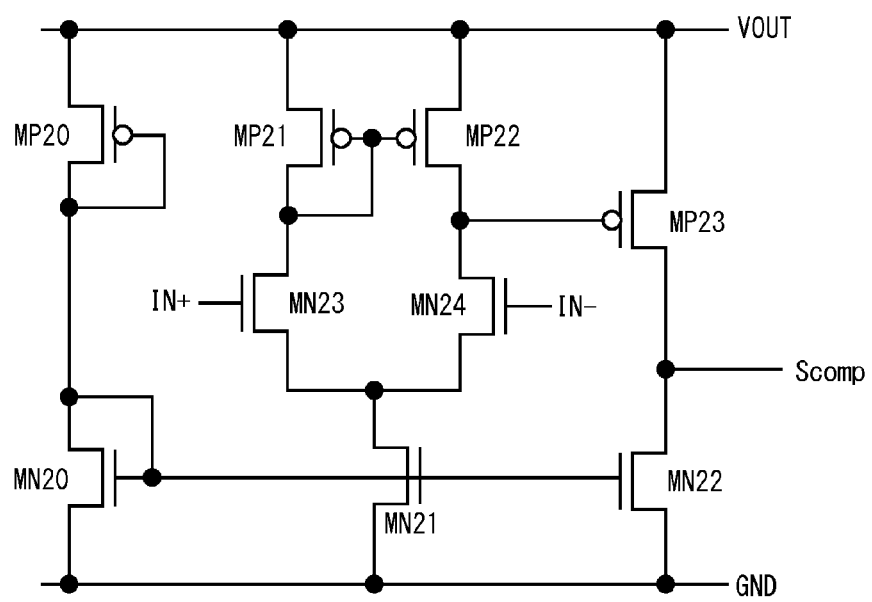
FIG. 21 is a block diagram of a comparator according to the third embodiment.

Next, a specific example of the comparator 85 will be described. FIG. 21 illustrates a circuit diagram of an example of the comparator 85. As illustrated in FIG. 21, the comparator 85 includes PMOS transistors MP20 to MP23 and NMOS transistors MN20 to MN24.

The PMOS transistor MP20 has a source connected to an output wire and a gate and a drain that are connected together. The drain of the PMOS transistor MP20 is connected to the drain of the NMOS transistor MN20. Moreover, the NMOS transistor MN20 has a source connected to the ground terminal and a gate and a drain that are connected together. The gates of the NMOS transistors MN21 and MN22 are connected in common to the gate of the NMOS transistor MN20. The sources of the NMOS transistors MN21 and MN22 are connected to the ground terminal. The PMOS transistor MP20 and the NMOS transistors MN20 to MN22 function as a current source.

The NMOS transistors MN23 and MN24 form a differential pair. The sources of the NMOS transistors MN23 and MN24 are connected to the drain of the NMOS transistor MN21. The gate of the NMOS transistor MN23 serves as the non-inverting input terminal of the comparator 85. The gate of the NMOS transistor MN24 serves as the inverting input terminal of the comparator 85.

The PMOS transistors MN21 and MP22 function as an active load circuit. The sources of the PMOS transistors MN21 and MP22 are connected to the output wire. The gate of the PMOS transistor MP21 is connected to the drain of the PMOS transistor MP21 and the gate and the drain are connected in common to the gate of the PMOS transistor MP22. The drain of the PMOS transistor MP21 is connected to the drain of the NMOS transistor MN23. The drain of the PMOS transistor MP22 is connected to the drain of the NMOS transistor MN24.

The source of the PMOS transistor MP23 is connected to the output wire. The gate of the PMOS transistor MP23 is connected to a wire that connects the drain of the PMOS transistor MP22 and the drain of the NMOS transistor MN22. The drain of the PMOS transistor MP23 is connected to the drain of the NMOS transistor MN22. The comparator 85 outputs the control signal Scomp from the node between the drain of the PMOS transistor MP23 and the drain of the NMOS transistor MN22.

Figure 22:
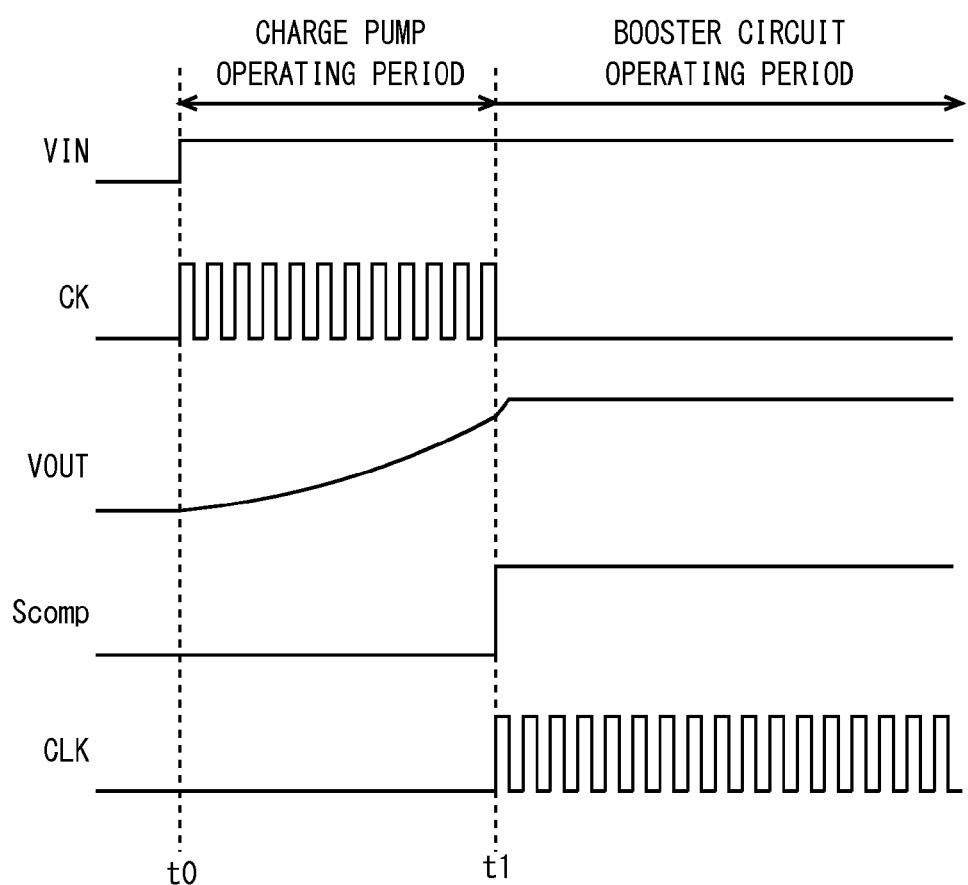
FIG. 22 is a timing chart for describing the operation of the semiconductor device according to the third embodiment.

Next, the operation of the semiconductor device 61 according to the third embodiment will be described. FIG. 22 illustrates a timing chart for describing the operation of the semiconductor device 61 according to the third embodiment. As illustrated in FIG. 22, in the semiconductor device 61 according to the third embodiment, at time t0 at which the supply of power from the power source 60 starts, the output voltage VOUT is lower than the threshold voltage (for example, a voltage at which the detection voltage Vdet reaches the reference voltage Vref) of the voltage monitoring circuit 64. Thus, the charge pump circuit 62 operates and the booster circuit 63 is suspended. As a result, the boosting operation of the charge pump circuit 62 starts at time t0. At time t1 at which the output voltage VOUT rises to reach the threshold voltage due to the boosting operation of the charge pump circuit 62, the voltage monitoring circuit 64 switches the control signal Scomp from Low to High. As a result, after time t1, the charge pump circuit 62 is suspended and the booster circuit 63 operates.

That is, in the semiconductor device 61 according to the third embodiment, the output voltage VOUT is increased by the boosting operation of the charge pump circuit 62 until the output voltage VOUT reaches a voltage at which the booster circuit 63 can operate efficiently. When the output voltage VOUT has become higher than the voltage at which the booster circuit 63 can operate efficiently, the charge pump circuit 62 is suspended and the booster circuit 63 is operated.

As described above, in the semiconductor device 61 according to the third embodiment, the charge pump circuit 62 performs the operation of boosting the output voltage VOUT until the output voltage VOUT reaches a voltage at which the booster circuit 63 can operate efficiently. Due to this, in the semiconductor device 61 according to the third embodiment, it is possible to shorten the rising time of the output voltage VOUT.

In the semiconductor device 61 according to the third embodiment, the charge pump circuit described in the first and second embodiments is used as the charge pump circuit 62. Due to this, in the semiconductor device 61 according to the third embodiment, it is possible to shorten the boosting time required for boosting the output voltage VOUT to a voltage at which the booster circuit 63 can operate efficiently. That is, in the semiconductor device 61 according to the third embodiment, by using the charge pump circuit described in the first and second embodiments, it is possible to further shorten the rising time of the output voltage VOUT.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

For example, in the semiconductor devices according to the embodiments, the conductivity type (p-type or n-type) of the semiconductor substrate, the semiconductor layer, the diffusion layer (diffusion region), and the like may be reversed. Thus, when one of the conductivity types n and p types is a first conductivity type and the other conductivity type is a second conductivity type, the first conductivity type may be p-type and the second conductivity type may be n-type, and conversely, the first conductivity type may be n-type and the second conductivity type may be p-type.

What is claimed is:

1. A semiconductor device comprising:
   a plurality of booster units which are connected in series between an input terminal and an output terminal so as to boost a voltage supplied to the input terminal according to a clock signal,
   each of the plurality of booster units including:
   an internal input terminal;
   an internal output terminal;
   a main transistor that is diode-connected so as to cause a forward current to flow in a direction from the internal input terminal toward the internal output terminal;
   a sub-transistor that is connected between a first terminal of the main transistor and a back-gate terminal of the main transistor and that has a control terminal connected to a second terminal of the main transistor;
   a resistor that connects the second terminal of the main transistor and the back-gate terminal of the main transistor; and
   a capacitor that is connected between the internal output terminal and a clock wire to which a clock signal is supplied,
   wherein the plurality of booster units include a first booster unit and a second booster unit,
   wherein the main transistor and the sub-transistor of the first booster unit are formed of P-type semiconductors and the first terminal is a source and the second terminal is a drain,
   wherein the main transistor and the sub-transistor of the second booster unit are formed of N-type semiconductors and the first terminal is a source and the second terminal is a drain, and
   wherein the first booster unit is disposed at a position where the main transistor and the sub-transistor are connected directly to the internal terminal and the second booster unit is disposed at a position where the main transistor and the sub-transistor are connected directly to the output terminal.

2. The semiconductor device according to claim 1, wherein a resistance value of the resistor is larger than a resistance value between a source and a drain in an ON state of the sub-transistor and smaller than a resistance value between the source and the drain in an OFF state of the sub-transistor.

3. The semiconductor device according to claim 1, further comprising an oscillator that supplies a first clock signal to a capacitor of an odd-numbered booster unit of the plurality of booster units and supplies a second clock signal, having a phase opposite to the first clock signal, to a capacitor of an even-numbered booster unit.

4. The semiconductor device according to claim 1, wherein the plurality of booster units include:
a group of the first booster units which is disposed on a side of the input terminal and includes at least one booster unit having the main transistor and the sub-transistor formed of P-type semiconductors; and
a group of the second booster units which is disposed on a side of the output terminal and includes at least one booster unit having the main transistor and the sub-transistor formed of N-type semiconductors.

5. The semiconductor device according to claim 1, further comprising:
a charge pump circuit including the plurality of booster units;
a booster circuit connected in parallel to the charge pump circuit; and
a voltage monitoring circuit that monitors an output voltage appearing in the output terminal so as to allow operation of the charge pump circuit and suspend operation of the booster circuit in a period in which the output voltage is lower than a predetermined threshold voltage while suspending operation of the charge pump circuit and allowing operation of the booster circuit in a period in which the output voltage is equal to or higher than the threshold voltage.

6. The semiconductor device according to claim 5, wherein the booster circuit is a switching regulator.

7. The semiconductor device according to claim 1, wherein the voltage supplied to the input terminal is output by a weak power source, the highest output voltage of which is lower than a lowest operating supply voltage of a load circuit that is connected to the output terminal.

8. The semiconductor device according to claim 1, further comprising an electrostatic protection element connected to the input terminal and the output terminal to provide an electrostatic breakdown protection for the plurality of booster units.

9. A semiconductor device comprising:
a plurality of booster circuits which are connected in series between an input terminal and an output terminal so as to boost a voltage supplied to the input terminal according to a clock signal,
each of the plurality of booster circuits including:
an internal input terminal;
an internal output terminal;
a first transistor that is diode-connected so as to cause a forward current to flow in a direction from the internal input terminal toward the internal output terminal;
a sub-transistor that is connected between a first terminal of the first transistor and a back-gate terminal of the first transistor and that has a control terminal connected to a second terminal of the first transistor;
a resistor that connects the second terminal of the first transistor and the back-gate terminal of the first transistor; and
a capacitor that is connected between the internal output terminal and a clock wire to which a clock signal is supplied,
wherein the plurality of booster circuits include a first booster circuit and a second booster circuit,
wherein the first transistor and the sub-transistor of the first booster circuit are formed of first conductivity type semiconductors and the first terminal is a source and the second terminal is a drain,
wherein the first transistor and the sub-transistor of the second booster circuit are formed of second conductivity type semiconductors and the first terminal is a source and the second terminal is a drain, and
wherein the first booster circuit is disposed at a position where the first transistor and the sub-transistor are connected to the internal terminal and the second booster circuit is disposed at a position where the first transistor and the sub-transistor are connected to the output terminal.

10. The semiconductor device according to claim 9, wherein the first booster circuit is disposed at the position where the first transistor and the sub-transistor are connected directly to the internal terminal and the second booster circuit is disposed at the position where the first transistor and the sub-transistor are connected directly to the output terminal.

11. The semiconductor device according to claim 9, wherein a resistance value of the resistor is larger than a resistance value between a source and a drain in an ON state of the sub-transistor and smaller than a resistance value between the source and the drain in an OFF state of the sub-transistor.

12. The semiconductor device according to claim 9, further comprising an oscillator that supplies a first clock signal to a capacitor of an odd-numbered booster circuit of the plurality of booster circuits and supplies a second clock signal, having a phase opposite to the first clock signal, to a capacitor of an even-numbered booster circuit.

13. The semiconductor device according to claim 9, wherein the first conductivity type is P-type and the second conductivity type is N-type.

14. The semiconductor device according to claim 9, wherein the plurality of booster circuits include:
a group of the first booster circuits which is disposed on a side of the input terminal and includes at least one booster circuit having the first transistor and the sub-transistor formed of first conductivity type semiconductors; and
a group of the second booster circuits which is disposed on a side of the output terminal and includes at least one booster circuit having the first transistor and the sub-transistor formed of second conductivity type semiconductors.

15. The semiconductor device according to claim 9, further comprising:
a charge pump circuit including the plurality of booster circuits;
a booster circuit connected in parallel to the charge pump circuit;
a voltage monitoring circuit that monitors an output voltage appearing in the output terminal so as to allow operation of the charge pump circuit and suspend operation of the booster circuit in a period in which the output voltage is lower than a predetermined threshold voltage while suspending operation of the charge pump circuit and allowing operation of the booster circuit in a period in which the output voltage is equal to or higher than the threshold voltage; and
an electrostatic protection element connected to the input terminal and the output terminal to provide an electrostatic breakdown protection for the charge pump circuit.

16. The semiconductor device according to claim 15, wherein the booster circuit is a switching regulator, and
wherein the electrostatic protection element comprises a diode.

17. The semiconductor device according to claim 9, wherein the voltage supplied to the input terminal is output by a weak power source, the highest output voltage of which is lower than a lowest operating supply voltage of a load circuit that is connected to the output terminal.

18. The semiconductor device according to claim 9, further comprising an electrostatic protection element connected to the input terminal and the output terminal to provide an electrostatic breakdown protection for the plurality of booster circuits, wherein the first conductivity type is P-type or N-type and the second conductivity type is the other of P-type or N-type.

* * * * *